US011729931B2

(12) United States Patent
Nelson, III

(10) Patent No.: US 11,729,931 B2
(45) Date of Patent: Aug. 15, 2023

(54) METROLOGY DEVICE SUPPORT SYSTEM

(71) Applicant: Itron, Inc., Liberty Lake, WA (US)

(72) Inventor: Kirby Kimble Nelson, III, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 17/850,749

(22) Filed: Jun. 27, 2022

(65) Prior Publication Data

US 2022/0330445 A1 Oct. 13, 2022

Related U.S. Application Data

(63) Continuation of application No. 17/119,723, filed on Dec. 11, 2020, now Pat. No. 11,382,227.

(60) Provisional application No. 63/072,020, filed on Aug. 28, 2020.

(51) Int. Cl.
*G01D 11/30* (2006.01)
*H05K 5/02* (2006.01)
*H05K 5/03* (2006.01)
*G01D 4/00* (2006.01)
*G01D 11/24* (2006.01)

(52) U.S. Cl.
CPC .......... *H05K 5/0221* (2013.01); *G01D 4/002* (2013.01); *G01D 11/24* (2013.01); *G01D 11/30* (2013.01); *H05K 5/03* (2013.01)

(58) Field of Classification Search
CPC .................................................... G01D 11/30
See application file for complete search history.

(56) References Cited

U.S. PATENT DOCUMENTS 6,734,663 B2 * 5/2004 Fye ...................... G01R 22/065
324/142
7,656,649 B2 * 2/2010 Loy ...................... G01R 22/065
361/667
7,821,776 B2 * 10/2010 Loy ........................ G01R 11/24
174/67

(Continued)

FOREIGN PATENT DOCUMENTS

CN 108282981 A 7/2018

OTHER PUBLICATIONS

Office Action for U.S. Appl. No. 17/119,723, dated Sep. 8, 2021, Nelson, III, "Metrology Device Support System", 5 Pages.

(Continued)

*Primary Examiner* — Hung V Ngo
(74) *Attorney, Agent, or Firm* — Lee & Hayes, P.C.

(57) ABSTRACT

A metrology device includes a housing, a lower support structure, a PCB coupled to the lower support structure, and a cover coupled to the lower support structure and the housing. The housing supports the cover in three coordinate directions. The lower support structure includes a first pillar that supports the PCB and mechanically couples with the cover. The first pillar causes the PCB to stand off from the lower support structure and causes the cover to stand off from the PCB. The metrology device also includes a second pillar that extends from the lower support structure to a base to cause the lower support structure to stand off from the base. The cover has a non-circle shape, and a cross section of the housing at a same elevation of the housing as an elevation of the cover within the housing is a circle.

19 Claims, 8 Drawing Sheets

(56) References Cited

U.S. PATENT DOCUMENTS

| | | | | |
|---|---|---|---|---|
| 7,843,391 | B2* | 11/2010 | Borisov | H01Q 9/0407 |
| | | | | 343/700 MS |
| 8,717,007 | B2* | 5/2014 | Banhegyesi | G01R 22/065 |
| | | | | 324/156 |
| 9,568,351 | B1 | 2/2017 | Gregory et al. | |
| 10,048,088 | B2* | 8/2018 | Spanier | G01D 4/002 |
| 2003/0025493 | A1 | 2/2003 | Fye et al. | |
| 2014/0251002 | A1 | 9/2014 | Bulteau et al. | |
| 2015/0276454 | A1 | 10/2015 | Laursen et al. | |
| 2017/0003149 | A1 | 1/2017 | Berk et al. | |
| 2017/0140256 | A1 | 5/2017 | Kobata et al. | |
| 2017/0199061 | A1 | 7/2017 | Wotton et al. | |
| 2017/0303424 | A1 | 10/2017 | Bobgan et al. | |
| 2018/0109047 | A1 | 4/2018 | Hoang et al. | |
| 2019/0250290 | A1 | 8/2019 | Oeverland | |
| 2020/0132521 | A1 | 4/2020 | Akiba et al. | |
| 2020/0256716 | A1 | 8/2020 | Gronauer | |
| 2021/0035241 | A1 | 2/2021 | Nelson, III et al. | |
| 2021/0318356 | A1 | 10/2021 | Cook | |
| 2022/0071033 | A1 | 3/2022 | Nelson, III | |

OTHER PUBLICATIONS

Canadian Office Action dated Sep. 12, 2022 for Canadian Patent Application No. 3,122,957, a foreign counterpart to U.S. Pat. No. 11,382,227, 5 pages.

* cited by examiner

METROLOGY DEVICE SUPPORT SYSTEM

RELATED APPLICATIONS

This application is a continuation of and claims priority to U.S. patent application Ser. No. 17/119,723, filed on Dec. 11, 2020, which claims priority to U.S. provisional patent application No. 63/072,020, filed Aug. 28, 2020, both of which are incorporated herein by reference.

TECHNICAL FIELD

The present disclosure relates generally to utility meters. Specifically, the present disclosure relates to systems and methods of venting and increasing convection of heat within a metrology device.

BACKGROUND

Utility metering units such as electric, water and gas meters are devices that measure the amount of the utility such as electricity, water, and gas consumed by a residence, a business, or an electrically powered device. During the lifetime of a utility metering unit, the utility metering unit may be exposed to a myriad of environmental conditions that may affect the performance and functionality of the utility metering unit. For example, the utility meter may be exposed to thermal fluctuations. Thermal fluctuations may be caused by electrical components within the utility meter creating heat within the enclosure of the utility meter. Further, the thermal fluctuations may be created as direct or indirect sunlight impinges on the utility meter throughout a given period of time.

These thermal fluctuations may create distinct areas within the utility meter that are relatively hotter than other areas. These environmental conditions may diminish the on-field longevity of the utility meter. Thus, the environmental conditions may result in higher costs to a utility provider and/or a utility consumer. A rise in temperature may overstress sensitive electronic components. Lower convective airflows, stagnant insulative air spaces, poor air mixing, and/or higher average temperatures within the meter may also contribute to the overstressing of the sensitive electronic components. For example, air flow and mixing may be impeded by the upper customer facing support structures such as, for example, housings, covers, nameplate bezels, and front plates, printed circuit boards (PCBs), support structures and other elements within the utility meter. Therefore, maximizing convective airflow while not compromising the structural integrity of the utility meter or exposing the electronics to harmful ultraviolet (UV) light exposure may prove difficult.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

DESCRIPTION OF EXAMPLE EMBODIMENTS

Figure 1:
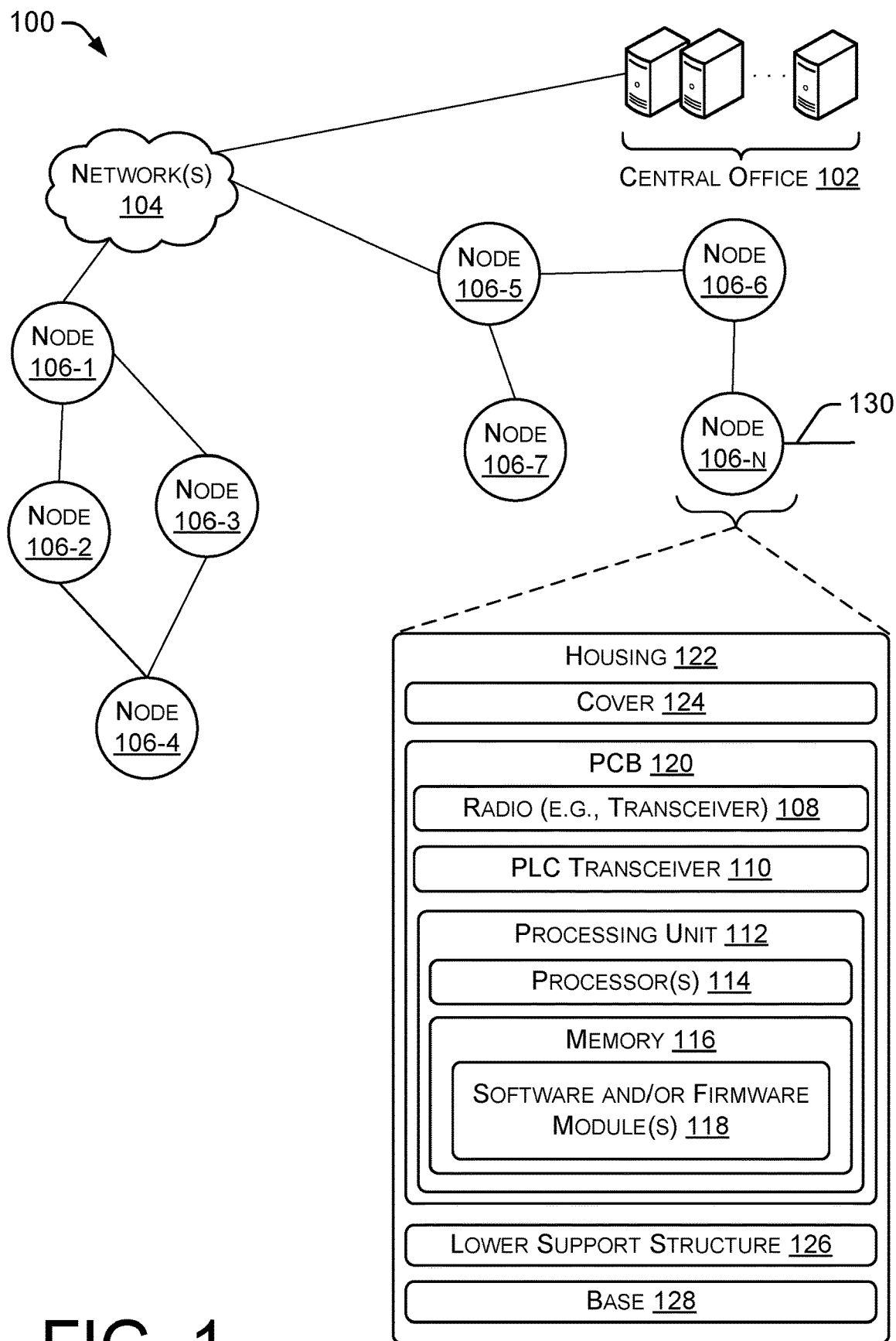
FIG. 1 is a diagram showing a high-level view of a network including nodes configured with temperature mitigation and air convection elements, according to an example of the principles described herein.

As mentioned above, a utility metering unit (also referred to herein as a "utility meter" or a "metrology device") may be subjected to various environmental conditions that cause thermal fluctuations to occur within the utility meter. Further, the utility meter may include areas within the utility meter that have relatively higher temperatures as compared to other areas within the utility meter since structures within the utility meter impede or prevent the flow of air throughout the internal portions of the utility meter. An increase in temperature within the utility meter overall and/or the creation of relatively warmer sections inside the utility meter may cause electric devices including radios, transceivers, processor(s), and even circuit elements such as resistors, inductors, capacitors, memristors, varistors, etc. to work less efficiently, prematurely fail, and even cause damage to neighboring elements within the utility meter. Thus, it is desirable to mitigate temperature rises within the utility meter in order to avoid overstress and/or failure of sensitive electronic components.

Mitigation of these temperature rises and pockets of high temperature may prove difficult. Some utility meters may include elements that lower convective airflow and promote stagnant insulative air spaces. This results in poor convective airflow and low air mixing which, in turn, creates higher average temperatures within the utility meter. In some utility meters, the convection of air throughout the internal portions of the utility meters may be primarily impeded by an upper, customer facing support structures such as inner covers and nameplate bezels. Further, the convection of air throughout the internal portions of the utility meters may be secondarily impeded by lower support structures within the utility meter.

In attempting to increase convective airflow within the interior of the utility meter, mechanical structures may be modified to increase the flow of air between portions of the utility meter. Maximizing convective airflow while not compromising the structural integrity of the utility meter will cause the utility meter to function more effectively, safely, and with reduced or eliminated failures. Further, by not exposing the sensitive electronics and electrical devices within the utility meter to harmful ultraviolet (UV) light will also cause the utility meter to function more effectively, safely, and with reduced or eliminated failures.

Overview

In the examples described herein, a reduction in internal temperature within, and consistent temperatures throughout the utility meter may be achieved by including the vented internal cover and edge mate support frame described herein. Further, the opaque outer cover described herein further contributes to mitigating increases in temperature due to solar heat gain caused by an increase in thermal energy within the utility meter as it absorbs incident solar radiation.

Examples described herein provide a metrology device including a base, a housing coupled to the base, a lower support structure coupled to the base, a printed circuit board (PCB) coupled to the lower support structure, and a cover coupled to the lower support structure and the housing, the cover covering the PCB. The cover includes a perimeter that includes at least one portion that stands off of or away from an interior surface of the housing.

The housing may be a white body. The lower support structure includes a first pillar. The first pillar supports the PCB and mechanically couples with the cover. The first pillar causes the PCB to stand off from the lower support structure and causes the cover to stand off from the PCB. The lower support structure includes a clip to mechanically couple the cover to the lower support structure. The lower support structure includes a second pillar. The second pillar extends from the lower support structure to the base to cause the lower support structure to stand off from the base.

The cover has a first area smaller than a second area of a cross section of the housing at a same elevation of the housing as an elevation of the cover within the housing. The cover has a first shape that is different from a second shape of a cross section of the housing at an elevation of the housing equal to a position of the cover within the housing. The cover has a non-circle shape, and a cross section of the housing at an elevation of the housing equal to a position of the cover within the housing is a circle.

Examples described herein also provide a support system of a metrology device. The support system includes a lower support structure, a printed circuit board (PCB) coupled to the lower support structure, and a cover coupled to the lower support structure, the cover covering the PCB. The lower support structure includes a first pillar. The first pillar supports the PCB and mechanically couples with the cover. The first pillar causes the PCB to stand off from the lower support structure and causes the cover to stand off from the PCB.

The lower support structure includes a first pillar. The first pillar supports the PCB and mechanically couples with the cover. The first pillar causes the PCB to stand off from the lower support structure and causes the cover to stand off from the PCB. The lower support structure includes a clip to mechanically couple the cover to the lower support structure. The lower support structure includes a second pillar. The second pillar extends from the lower support structure to a base to cause the lower support structure to stand off from the base.

The support system further includes a base supporting the lower support structure, and a housing coupled to the base. The housing supports the cover in three coordinate directions. The housing may be a white body. The cover has a first area smaller than a second area of a cross section of the housing at a same elevation of the housing as an elevation of the cover within the housing. The cover has a first shape that is different from a second shape of a cross section of the housing at an elevation of the housing equal to a position of the cover within the housing. The cover has a non-circle shape, and a cross section of the housing at an elevation of the housing equal to a position of the cover within the housing is a circle.

Examples described herein also provide a metrology device including a housing, a lower support structure, a printed circuit board (PCB) coupled to the lower support structure, and a cover coupled to the lower support structure and the housing. The cover covers the PCB. The housing supports the cover in three coordinate directions. The lower support structure includes a first pillar. The first pillar supports the PCB and mechanically couples with the cover. The first pillar causes the PCB to stand off from the lower support structure and causes the cover to stand off from the PCB. The metrology device also includes a clip to mechanically couple the cover to the lower support structure. The metrology device also includes a second pillar. The second pillar extends from the lower support structure to a base to cause the lower support structure to stand off from the base. The cover has a non-circle shape, and a cross section of the housing at an elevation of the housing equal to a position of the cover within the housing is a circle.

Example Embodiments

Turning now to the figures, FIG. 1 is a diagram showing a high-level view of a network architecture 100 including nodes 106 configured with temperature mitigation and air convection elements, according to an example of the principles described herein. FIG. 1 also includes a component diagram of example components of a node 106 that includes the temperature mitigation and air convection elements. The network architecture 100 includes a plurality of node(s) 106-1, 106-2, 106-3, 106-4, 106-5, 106-6, 106-7, . . . , 106-N, where N is any integer greater than or equal to 1 (collectively referred to herein as node(s) 106 unless specifically addressed otherwise). The nodes 106 are communicatively coupled to each other via direct communication paths or "links." In this example, N represents a number of nodes in an autonomous routing area (ARA), such as a wide area network (WAN), metropolitan area network (MAN), local area network (LAN), neighborhood area network (NAN), field area network (FAN), personal area network (PAN), among other types of networks. As an example, nodes 106 may be configured in a radio frequency (RF) mesh, a power line communication (PLC) mesh, or both. In one example, nodes 106 may be part of a low power and lossy network (LLN).

As used in the present specification and in the appended claims, the term "link" is meant to be understood broadly as any direct communication path between two nodes (e.g., a "one hop" transmission that does not pass through or become propagated by another node). Each link may represent a plurality of channels or one or more variable data rate channels over which a node 106 is able to transmit or receive data. Each link may include multiple communication technologies, such as, for example, one or more RF communication technologies, one or more PLC communication technologies, or both (among other communication technologies). Thus, the communication technologies may utilize RF signals and/or PLC signals (among other types of signals) in communicating with one another and with other devices, systems, and networks such as, for example, a central office 102.

One or more channels may use a power line communication (PLC) system to communicate using a PLC communications technology. Thus, a link may include portions based on multiple communication medias including PLC portions. Likewise, various links may use multiple different PLC communications technologies (e.g., various modulation techniques, bandwidths, data rates, center frequencies, protocols, etc.).

The channels on a link may include a control channel and multiple data channels. In one example, the control channel may be utilized for communicating one or more messages between nodes to specify one of the data channels utilized to transfer data. Generally, transmissions on the control channel are shorter relative to transmissions on the data channels. Once specified, the nodes 106 may move to the data channel for communication.

Each of the nodes 106 may be implemented as, or associated with, any of a variety of computing devices such as, for example, smart utility meters (e.g., electric, gas, and/or water meters), sensors (e.g., temperature sensors, weather stations, frequency sensors, etc.), control devices, transformers, routers, servers, relays (e.g., cellular relays), switches, valves, power line communication (PLC) transceivers, combinations of the foregoing, or any device couplable to a communication network and capable of sending and/or receiving data.

In this example, the nodes 106 may also be configured to communicate with one or more central processing facilities such as the central office 102 via an edge device (e.g., cellular relay, cellular router, edge router, destination oriented directed acyclic graph (DODAG) root, etc.) which serves as a connection point of the ARA to a backhaul network(s), such as the Internet or one or more public or private intranets. In the illustrated example, node 106-1 may serve as an edge device and/or cellular relay to relay communications from the other nodes 106-2 through 106-N of the ARA to and from the central office 102 via the network(s) 104.

As an example, node 106-N may be representative of each of the nodes 106 and includes a printed circuit board (PCB) 120, a radio (e.g., a transceiver) 108, a PLC transceiver 110, a processing unit 112, and a memory 116. The PCB 120 may include any device that mechanically supports and electrically connects electrical or electronic components using conductive traces, tracks, pads, and other features etched from one or more sheet layers of copper laminated onto and/or between sheet layers of a non-conductive, insulating substrate. The electrical or electronic components may be soldered onto the PCB 120 to both electrically connect and mechanically fasten them to the PCB 120. Elements that may be mechanically and/or electrically coupled to the PCB 120 may include the radio 108, the PLC transceiver 110, the processing unit 112 along with its processor(s) 114, and the memory 116, among other elements.

In the examples described herein, the PCB 120 may also be coupled to one or more structural elements within the node 106 to mutually mechanically support the PCB 120 and the one or more structural elements. As described in more detail below, the PCB 120 may be mechanically coupled to a cover 124, a lower support structure 126, and a base 128 (among other elements) either directly or indirectly such that these elements cooperatively support one another as a single unit when coupled together. The manner in which the PCB 120, the cover 124, the lower support structure 126, and the base 128 are coupled reduce or eliminate possible damage to the node 106 when being manufactured, transported to an installation location, installed at the location, and/or when maintenance is being performed on the node 106. In the examples described herein, the mutual mechanical support may support these elements of the node 106 in the x, y, and z coordinate directions.

The radio 108 may include a radio frequency (RF) transceiver that may be configured to receive RF signals associated with multiple different RF communication technologies (e.g., FSK, OQPSK, OFDM, CDMA, etc.) at a variety of data rates, and transmit RF signals via one or more of a plurality of RF communication technologies. The radio 108 may include a multiple protocol receiver and may be configured to listen for a plurality of different RF communication technologies in a parallel fashion across multiple links. The radio 108 may also be configured to determine, or facilitate determination of, a received signal strength, such as a "received signal indicator" (RSI) for one or more of the plurality of different RF communication technologies.

In some implementations, each of the nodes 106 includes a single radio 108 configured to send and receive data on multiple different channels, such as the control channel and multiple data channels of each communication link. The radio 108 may also be configured to implement a plurality of different data rates, protocols, signal strengths, and/or power levels. The network architecture 100 may represent a heterogeneous network of nodes 106, in that the nodes 106 may include different types of nodes (e.g., smart meters, cellular relays, sensors, etc.), different generations or models of nodes, and/or nodes that otherwise are capable of transmitting on different channels and using different communication technologies, data rates, protocols, signal strengths, and/or power levels.

The power line communication (PLC) transceiver 110 is configured to transmit and/or receive one or more communication signals on electrical power wiring, including local power wiring and long distance high voltage transmission lines. The PLC transceiver 110 may transmit and/or receive different types of power line communications that include one or more PLC communication technologies (e.g., narrowband PLC, broadband PLC, power line digital subscriber line (PDSL), power line telecom (PLT), power line networking (PLN), broadband over power lines (BPL), etc.) having one or more frequency bands, channels, data rates and/or types of modulation that may depend on the propagation characteristics of the power wiring used.

The processing unit 112 is coupled to the radio 108, the PLC transceiver 110, and the memory 116, and may include one or more processor(s) 114 communicatively coupled to the memory 116. The memory 116 may be configured to store one or more software and/or firmware modules 118, which are executable on the processor(s) 114 to implement various functions. While the modules are described herein as being software and/or firmware executable on a processor, in other examples, any or all of the modules may be implemented in whole or in part by hardware (e.g., as an application specific integrated circuit (ASIC), a specialized processing unit, digital signal processor, etc.) to execute the described functions. In the example of FIG. 1, the memory 116 includes any software and/or firmware executable to bring about any function of the node 106 as a utility meter and a device within a network of nodes 106 including send and receive communications, detect utility consumption, and process data, among other functions of a utility meter.

The memory 116 may comprise computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include communication media, such as modulated data signals and carrier waves.

The network(s) 104 may represent a backhaul network, which may itself comprise a wireless or a wired network, or a combination thereof. The network(s) 104 may be a collection of individual networks interconnected with each other and functioning as a single large network (e.g., the Internet and/or one or more intranets). Further, the individual networks may be wireless or wired networks, or a combination thereof.

The central office 102 may be implemented by one or more computing devices, such as servers, personal computers, and laptop computers, among others. The one or more computing devices may be equipped with one or more processor(s) communicatively coupled to memory. In some examples, the central office 102 includes a centralized meter data management system which performs processing, analysis, storage, and/or management of data received from one or more of the nodes 106. For example, the central office 102 may process, analyze, store, and/or manage data obtained from a smart utility meter, sensor, control device, router, regulator, server, relay, switch, valve, and/or other nodes. Although the example of FIG. 1 illustrates the central office 102 in a single location, in some examples the central office may be distributed amongst multiple locations and/or may be eliminated entirely (e.g., in the case of a highly decentralized distributed computing platform).

Electrical power may be measured by the node 106-N as the power is used or consumed by a consumer. In one example, a transformer (not shown) delivers power to a consumer by an electrical conductor 130. In one example, the quantity of power that is delivered is measured by a metrology unit associated with node 106-N. The metrology unit associated with node 106-N is able to detect, measure, interrupt, and protect the node 106-N from the power delivered over the conductor 130. The electrical power measured by the metrology unit may be transmitted to the central office 102, and the central office 102 may be configured to include collection engine (CE) functionality. In one example, aspects of the CE functionality may be distributed, partly or fully, within some or all of the nodes 106. The central office 102 and its functionality may be centralized within a utility company, distributed among locations within the network 104, and/or located in a data center location or "cloud" environment.

Having described the environment in which the node 106 operates, the physical elements of the node 106 (e.g., utility meter) will now be described in connection with FIGS. 2 through 8. Although the nodes 106 have been referred to as "nodes" within this description, the nodes 106 may also be referred to as a utility metering unit, a utility meter, or a metrology device, and will be referred to as a utility meter in connection with FIGS. 2 through 8 to invoke the physical aspects of the utility meter 106. In FIGS. 1 through 8, reference numbers are numbered based on the first figure in numerical order in which that element is introduced. Therefore, reference within the drawings to an element may be made to the figure numbered as the number of the first digit (e.g., hundreds place) of that element.

Figure 2:
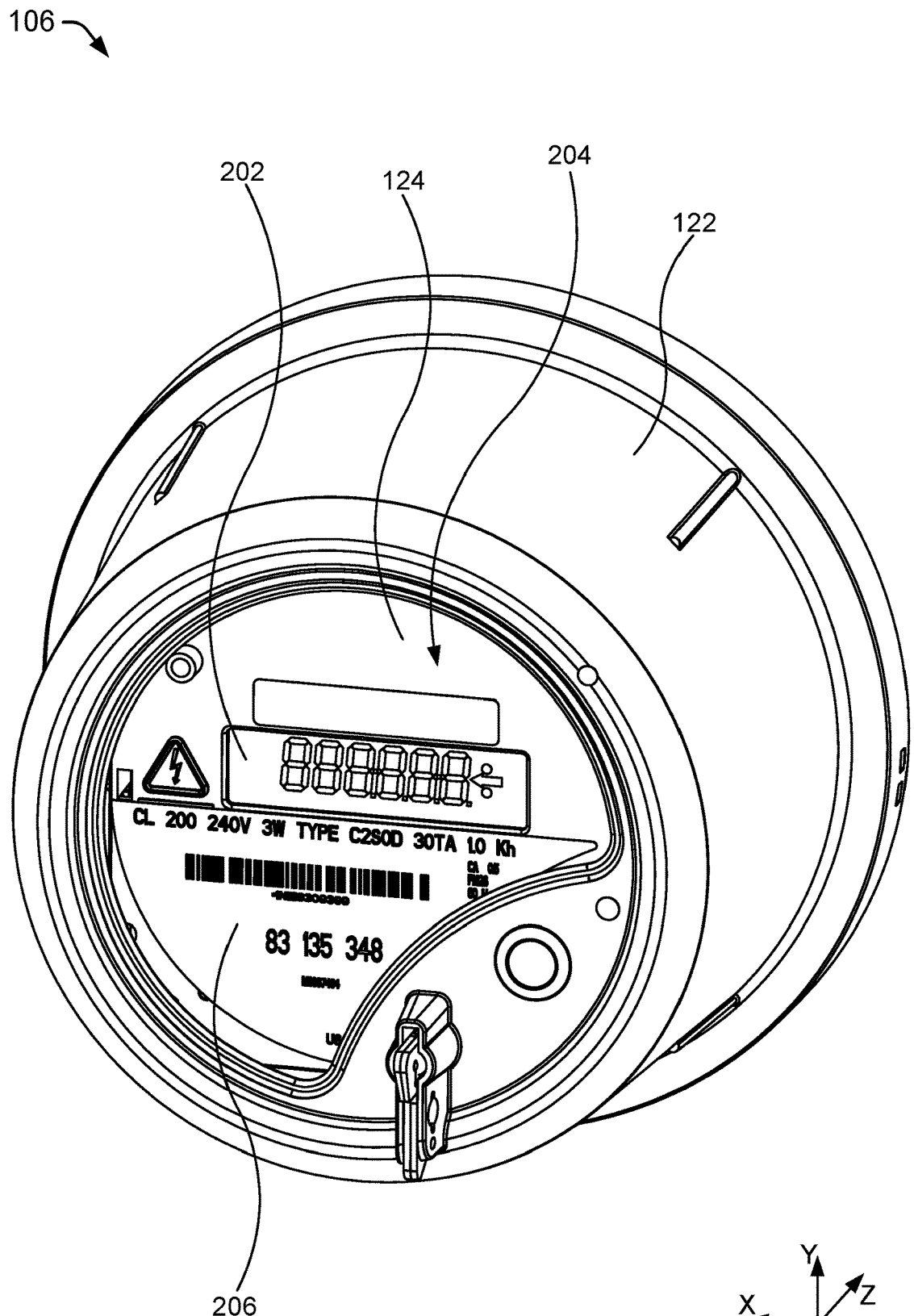
FIG. 2 illustrates a perspective view of a utility meter, according to an example of the principles described herein.
Figure 3:
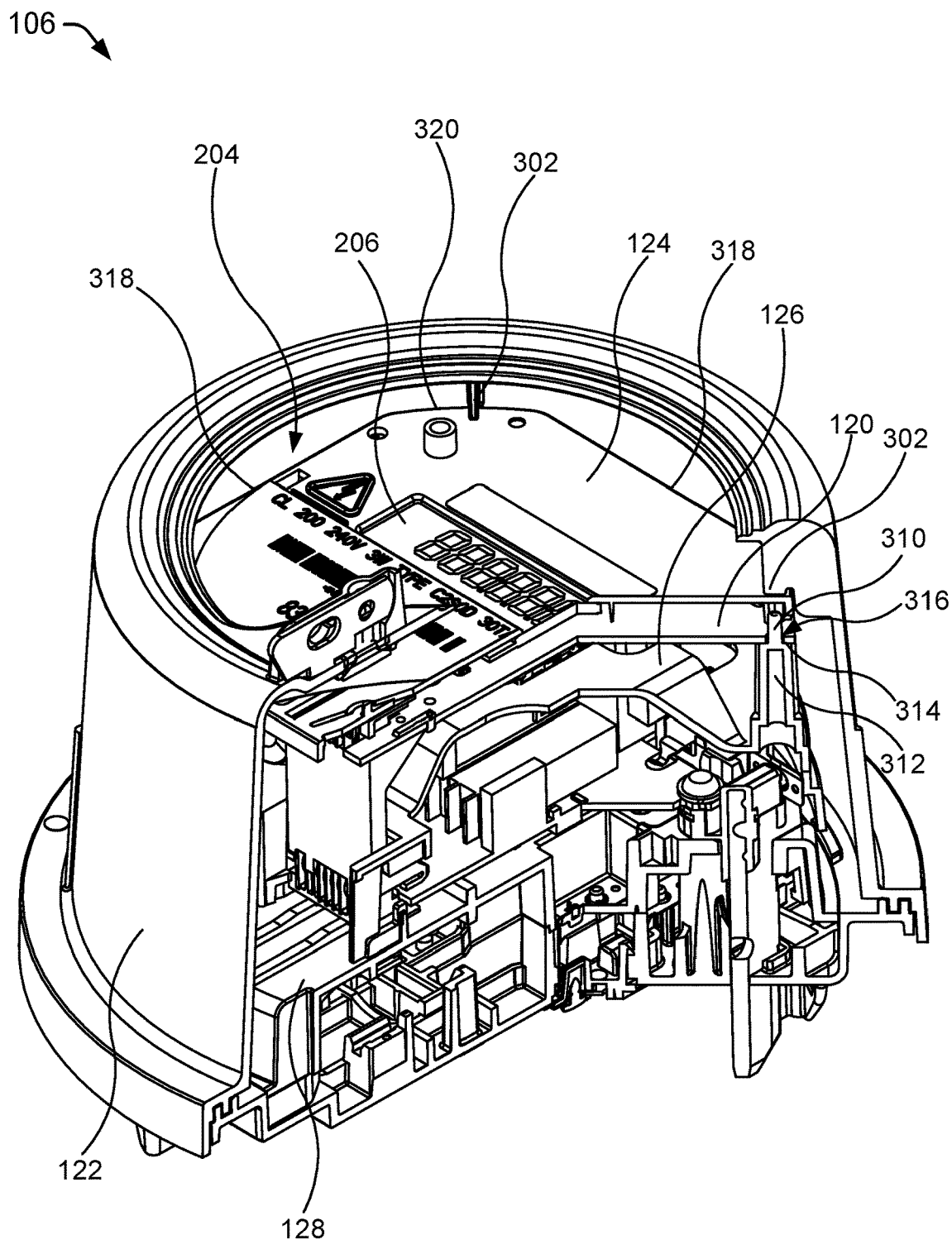
FIG. 3 illustrates a cut-away, perspective view of a utility meter, according to an example of the principles described herein.
Figure 4:
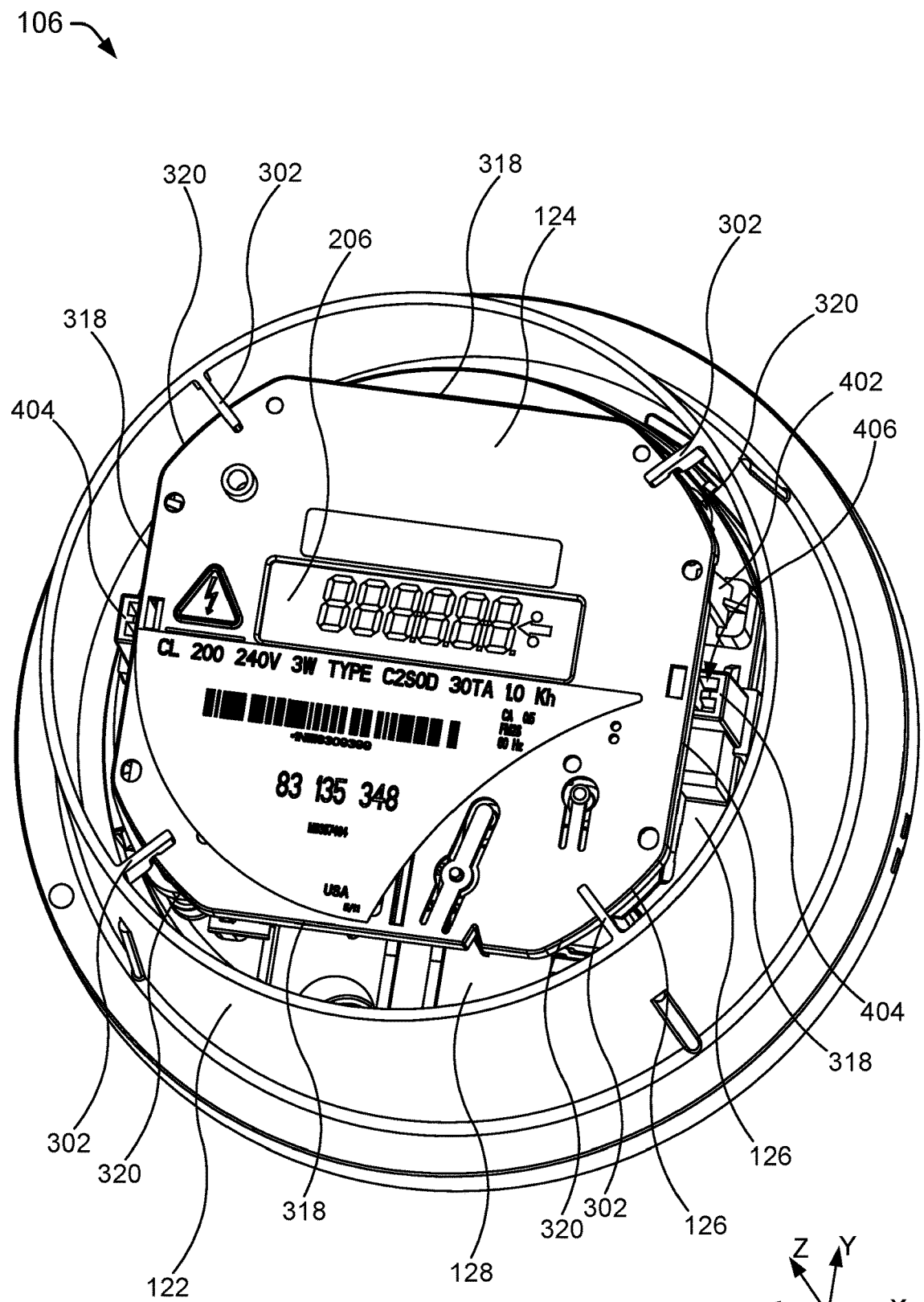
FIG. 4 illustrates a cut-away, perspective view of a utility meter, according to an example of the principles described herein.
Figure 5:
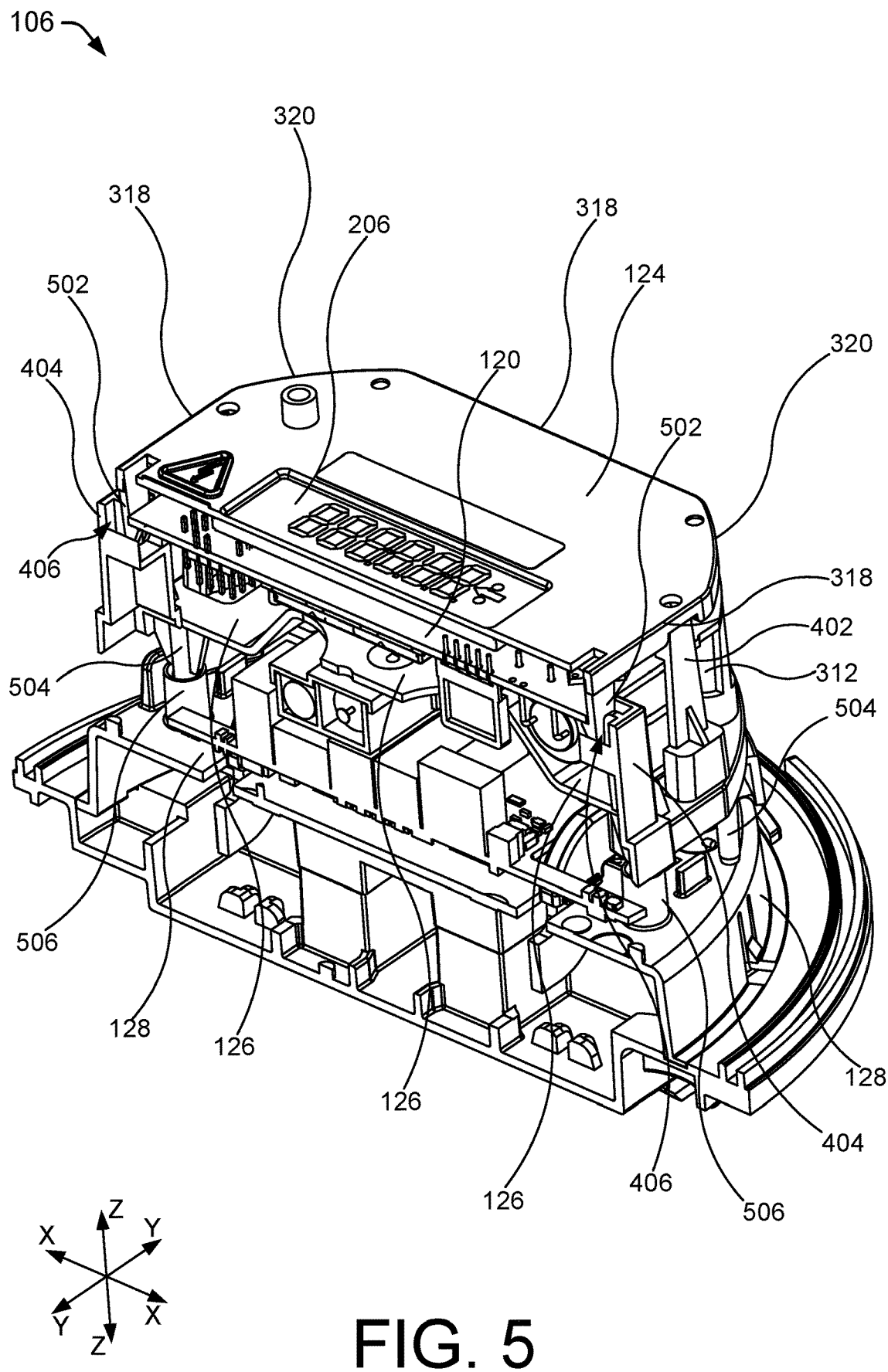
FIG. 5 illustrates a cut-away, perspective view of a utility meter with a housing removed, according to an example of the principles described herein.
Figure 6:
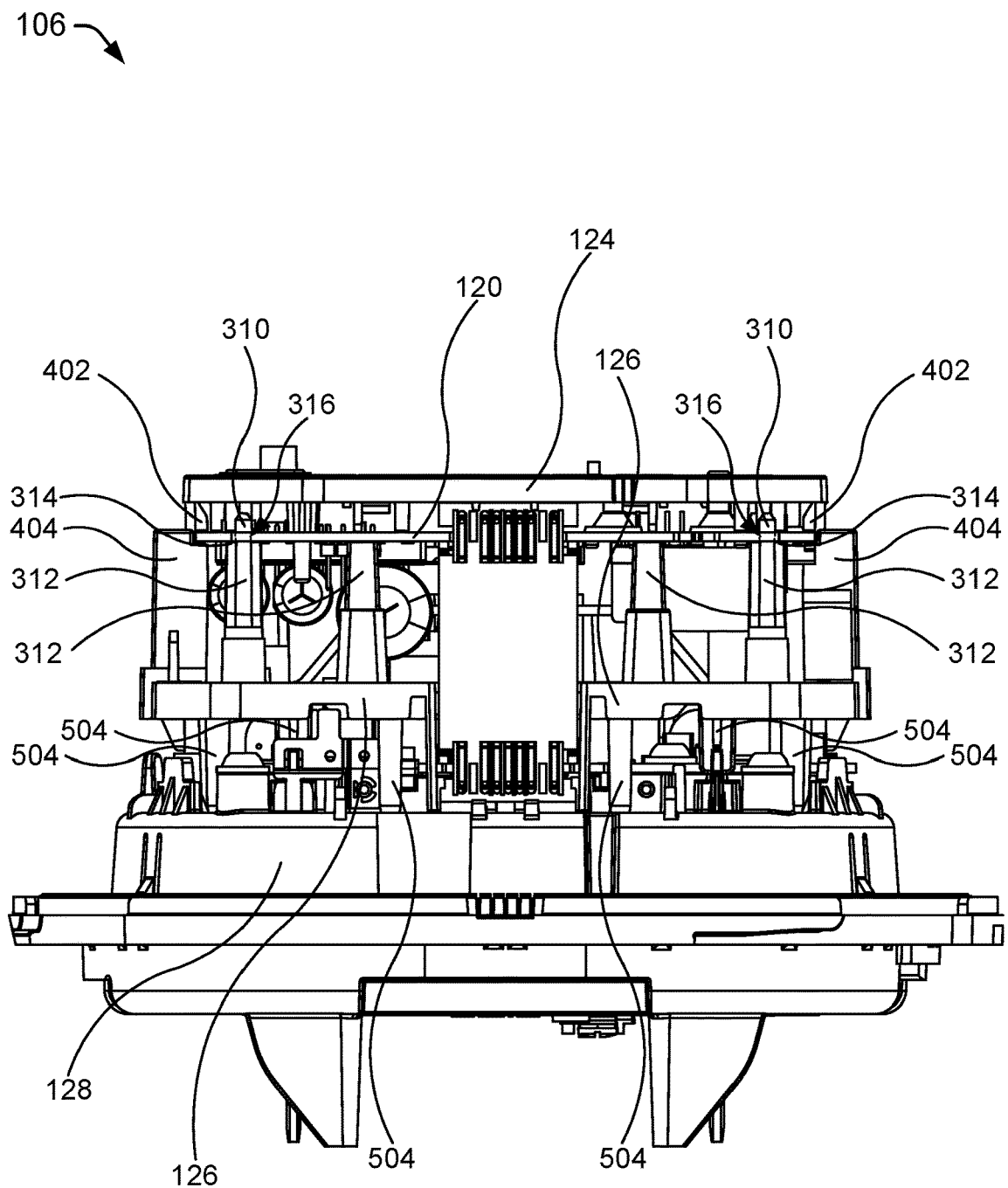
FIG. 6 illustrates a side view of a utility meter with a housing removed, according to an example of the principles described herein.
Figure 6:
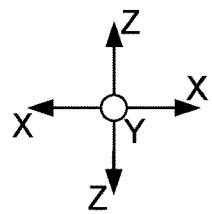
Figure 7:
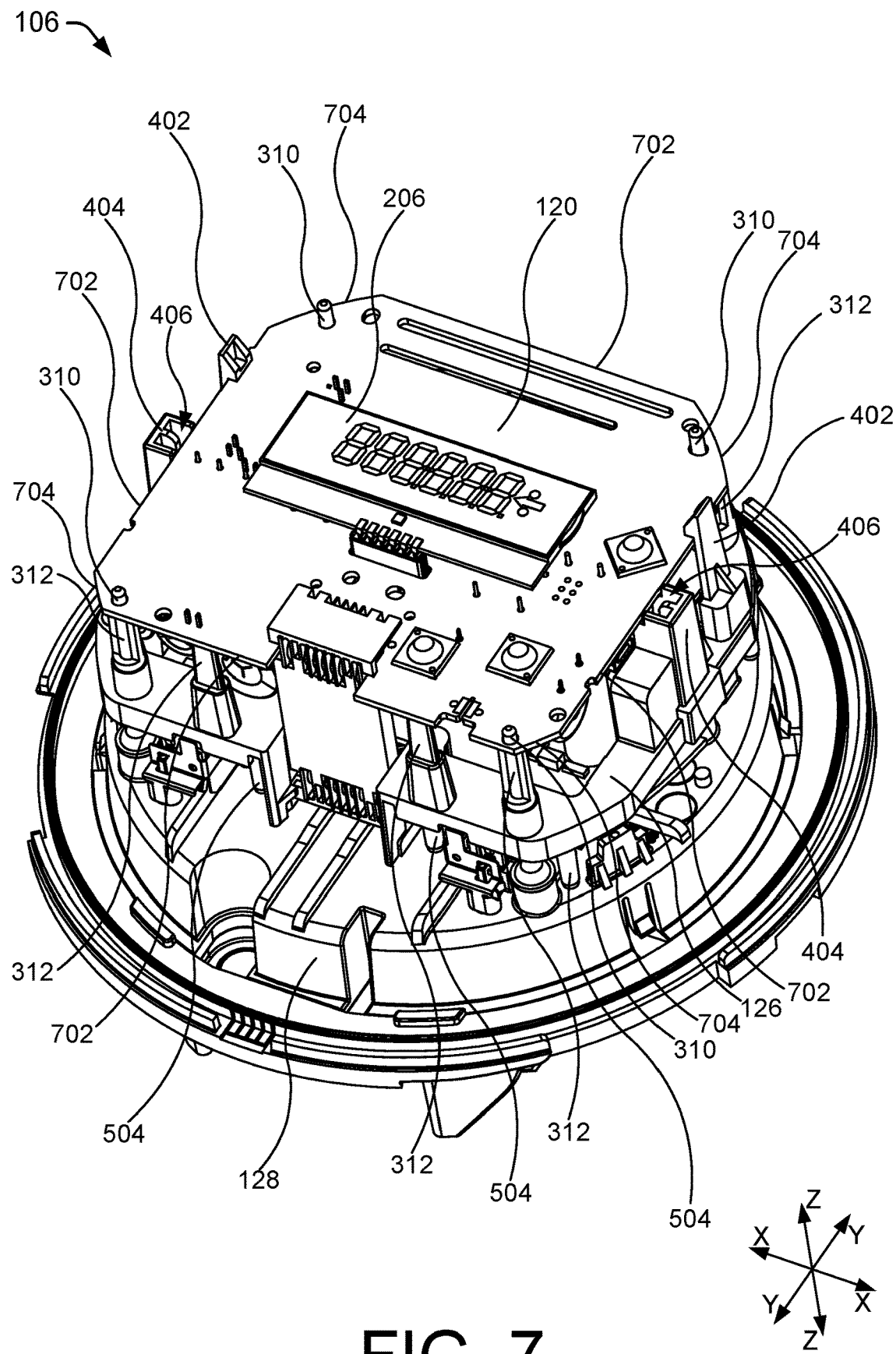
FIG. 7 illustrates a perspective view of a utility meter with a housing removed, according to an example of the principles described herein.
Figure 8:
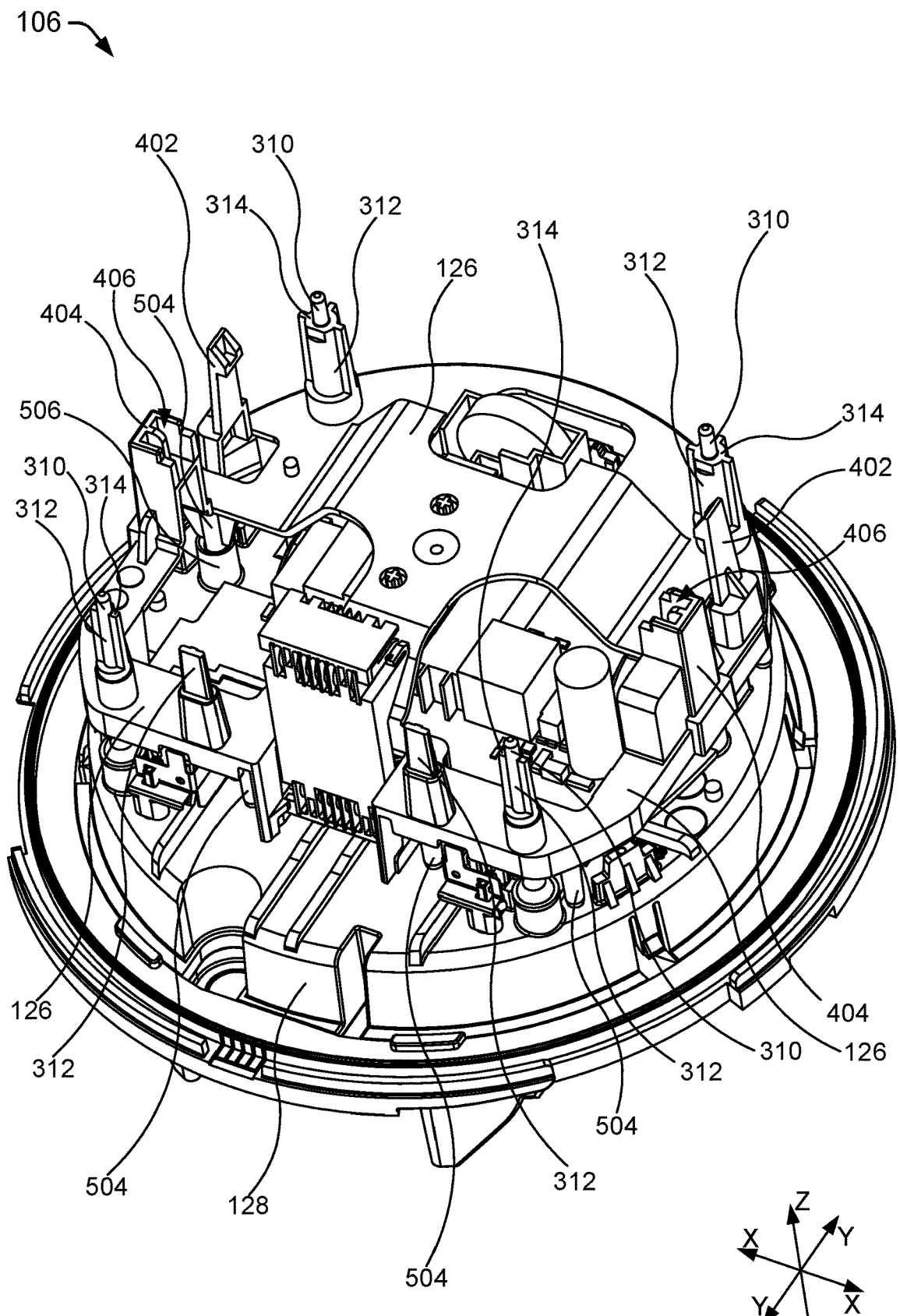
FIG. 8 illustrates a perspective view of a utility meter with a housing and a cover removed, according to an example of the principles described herein.

FIG. 2 illustrates a perspective view of a utility meter 106, according to an example of the principles described herein. FIG. 3 illustrates a cut-away, perspective view of the utility meter 106, according to an example of the principles described herein. FIG. 4 illustrates a cut-away, perspective view of the utility meter 106, according to an example of the principles described herein. FIG. 5 illustrates a cut-away, perspective view of the utility meter 106 with a housing 122 removed, according to an example of the principles described herein. FIG. 6 illustrates a side view of the utility meter 106 with the housing 122 removed, according to an example of the principles described herein. FIG. 7 illustrates a perspective view of the utility meter 106 with the housing 122 removed, according to an example of the principles described herein. FIG. 8 illustrates a perspective view of the utility meter 106 with the housing 122 and a cover 124 removed, according to an example of the principles described herein.

The housing 122 may be any enclosure that covers the entirety of the cover 124, the PCB 120, and the lower support structure 126, and at least portions of the base 128. In one example, the housing 122 is opaque to provide solar shading and UV light protection for the components within the utility meter 106. In one example, the housing 122 includes a "white body" material whose surface absorbs relatively little or no electromagnetic radiation of any wavelength. Stated in another manner, the white body of the housing 122 may be a material that exhibits relatively little or zero absorptivity for all wavelengths. A "white body" is in contrast to a "black body" that absorbs all incident electromagnetic radiation regardless of frequency or angle of incidence. In one example, the white body of the housing 122 may be a white material that absorbs relatively less electromagnetic radiation and/or whose surface absorbs relatively little or no electromagnetic radiation of any wavelength. By providing the white body of the housing 122, the utility meter 106 reflects more incident electromagnetic radiation relative to a housing that is another color (e.g., gray, green, blue, etc.). This, in turn, reduces the solar heat gain caused by an increase in thermal energy within the utility meter as it absorbs incident solar radiation since at least a portion of that incident solar radiation is reflected off of the housing 122 as compared to housings of different colors.

The cover 124, PCB 120, and lower support structure 126 are located below the housing 122 and between the housing 122 and the base 128. The base 128 may couple to the housing 122 such that the base 128 serves as part of the housing 122 enclosing a rear open end of the housing 122. In this manner, the housing 122 and the base 128 serve to enclose cover 124, PCB 120, and lower support structure 126 along with any other mechanical and electrical elements associated therewith and/or contained therein. The housing 122 may be coupled to the base 128 by, for example, one or more of snap-fit fasteners, screws, bolts and nuts, dowels, pins, clips, mating threads between the housing 122 and the base 128, keys, latches, rivets, tracks, channels, groves, and other fastening elements or devices. The base 128 may be coupled to a surface of a residence, a business, or an electrically powered device for which the utility meter 106 is used to measure the amount of the utility consumed.

The housing 122 may include an opening 204 that exposes the cover 124 so, for example, user-readable information displayed on the cover 124 may be viewed by a user. In one example, the opening 204 may include a transparent material such as, for example, glass, plastic, etc. to ensure that objects, precipitation, dust, dirt, and other environmental contaminants do not enter the utility meter 106 while still allowing for the reading of the user-readable information displayed on the cover 124. As depicted in FIGS. 2 through 5 and 7, the cover 124 may include an output device 202 that presents to a user information such as, for example, a reading of an amount of utility consumed as measured by the utility meter 106. In the example of FIGS. 2-8, the output device 202 is a liquid crystal display (LCD), but any type of output device may be used including, for example, a light-emitting diode (LED) display, an organic light-emitting diode (OLED) display, a thin-film transistor (TFT) LCD display, a printing device, and other output devices.

The cover 124 may also include printed information 206 affixed to or printed on the cover 124. This printed information 206 may include, for example, information about the utility meter 106 such as serial numbers, model numbers, voltage ratings, electrical specification, and other information that may assist a user such as a technician in identifying the utility meter 106 and its functions and capabilities.

As depicted in FIGS. 3 through 8, the base 128 may support and/or be coupled to the lower support structure 126. The lower support structure 126 may include a number of first or upper pillars 312 and a number of second or lower pillars 504. The lower pillars 504 are formed on the lower support structure 126 to extend down toward the base 128 and engage with and/or couple to the base 128 to secure the lower support structure 126 to the base 128. In one example, the lower pillars 504 may engage with a number of retention sleeves 506 to retain the lower support structure 126 in alignment with the base 128 in at least the x-direction and y-direction as indicated by the coordinate indicators presented on each of FIGS. 2 through 8. In one example, the lower pillars 504 may couple with the retention sleeves 506 such that the lower support structure 126 is also maintained in alignment with the base 128 in the z-direction.

The upper pillars 312 are formed on the lower support structure 126 to extend upwards towards the PCB 120 and cover 124. The upper pillars 312 may extend upwards to engage with and/or couple to the PCB 120 and/or the cover 124 to secure the PCB 120 and/or the cover 124 to one another, to the lower support structure 126, to the base 128 and/or the housing 122, either directly or indirectly. In one example, the upper pillars 312 include protrusions 310 that extend from the ends of the upper pillars 312 through apertures 316 defined in the PCB 120. The PCB 120 may seat on ridges 314 formed on the upper pillars 312 at the base of the protrusions 310. In this manner, the upper pillars 312 along with the protrusions 310 extending through the apertures 316 defined in the PCB 120 may retain the lower support structure 126, and the PCB 120 in alignment in at least the x-direction and y-direction as indicated by the coordinate indicators presented on each of FIGS. 2 through 8. Further, this arrangement causes the PCB 120 to be secured to the lower support structure 126 such that movement of the PCB 120 relative to the lower support structure 126 is minimized in at least the x-direction and y-direction. Further, the formation of the ridges 314 on the upper pillars 312 supports the PCB 120 and minimizes movement of the PCB 120 in the negative z-direction, the negative z-direction being in the direction of the base relative to the PCB 120.

In one example, a number of the upper pillars 312 may not include protrusions 310 but may include ends at a point along the height of these upper pillars 312 where the ridges 314 are formed on those upper pillars 312 that do include the protrusions 310. These upper pillars 312 without the protrusions 310 support the PCB 120 and minimize movement of the PCB 120 in the negative z-direction as the ridges 314 do in the upper pillars 312 that do include protrusions 310.

In one example, the upper pillars 312 and/or the lower pillars 504 may be formed along a perimeter or outer edge of the lower support structure 126. By placing the upper pillars 312 and/or the lower pillars 504 at the outer edge of the lower support structure 126, air within the enclosed utility meter 106 may convect to allow for heated air to move freely throughout the utility meter 106 within the housing 122 from one area to another. A number of electrically powered devices and elements included within the utility meter 106 may produce heat within the housing 122 of the utility meter 106. Further, the utility meter 106 may be exposed to direct or indirect electromagnetic radiation from the sun which may cause the internal temperature within the utility meter 106 to increase. Convection within the utility meter 106 that allows for heated air from one area inside the utility meter 106 to move to relatively cooler areas may cause the electrically powered devices and elements to operate at cooler temperatures, increase their lifetime, and/or increase their efficiency. For example, heat produced by the electrically powered devices and elements located on the PCB 120 heats the air within the housing 122 of the utility meter 106, and this heated air is allowed to move past the upper pillars 312 and/or the lower pillars 504 to other areas within the housing 122 resulting in a cooler environment in which the upper pillars 312 and/or the lower pillars 504 may operate. Further, in one example, the upper pillars 312 and/or the lower pillars 504 may be dispersed along the perimeter or outer edge of the lower support structure 126 such that air may easily flow between two neighboring pillars.

The lower support structure 126 may further include a number of pedestals 404. The PCB 120 may also be seated on the pedestals 404. The pedestals 404 may, like the upper pillars 312, support the PCB 120 and minimize movement of the PCB 120 in the negative z-direction as the ridges 314 do in the upper pillars 312. Further, the pedestals 404 may include recesses 406 defined in the pedestals 404. The recesses 406 allow for snap-fit fasteners 502 formed on the cover 124 and extending down past the PCB 120 and to the lower support structure 126. For example, the snap-fit fasteners 502 are formed on the cover 124 above the pedestals 404 and engage with a bottom of the PCB 120 as the snap-fit fasteners 502 elastically deform and deflect around the PCB 120 and return to their original state. In this manner, the snap-fit fasteners 502 couple the cover 124 to the PCB 120 and retain the cover 124 in alignment with and in engagement with the PCB 120 and the lower support structure 126 since the recesses 406 retain the snap-fit fasteners 502 therein. For example, engagement of the snap-fit fasteners 502 of the cover 124 to the PCB 120 and, simultaneously, within the recesses 406 of the lower support structure 126 causes the cover 124, the PCB 120, and the lower support structure 126 to be coupled to one another and remain aligned relative to one another in the x-, y-, and z-directions.

The lower support structure 126 also includes a number of snap-fit fasteners 402. The snap-fit fasteners 402 of the lower support structure 126 couple the PCB 120 to the lower support structure 126. For example, the snap-fit fasteners 402 of the lower support structure 126 extend towards the PCB 120 and the cover 124. The snap-fit fasteners 402 are formed on the lower support structure 126 along any portion of the lower support structure 126 and engage with a top of the PCB 120 as the snap-fit fasteners 402 elastically deform and deflect around the PCB 120 and return to their original state. In this manner, the snap-fit fasteners 402 couple the lower support structure 126 to the PCB 120 and retain the lower support structure 126 in alignment with and in engagement with the PCB 120 and the cover 124. For example, engagement of the snap-fit fasteners 402 of the lower support structure 126 to the PCB 120 causes the cover 124, the PCB 120, and the lower support structure 126 to be coupled to one another and remain aligned relative to one another in the x-, y-, and z-directions.

As the snap-fit fasteners 502 of the cover 124 and the snap-fit fasteners 402 of the lower support structure 126 couple to the PCB 120, the cover 124, the PCB 120, and the lower support structure 126 are coupled to one another and remain aligned relative to one another in the x-, y-, and x-directions. This alignment and mechanical coupling between the cover 124, the PCB 120, and the lower support structure 126 reduces or eliminates the possibility of damage occurring to the utility meter 106 during manufacture of the utility meter 106, transportation of the utility meter 106 to an installation location, installation at the location, and/or during maintenance performed on the utility meter 106.

Turning again to the housing 122, a number of retention tabs 302 may be formed on an internal surface of the housing 122. The retention tabs 302 retain and support the cover 124, the PCB 120, and the lower support structure 126 within the utility meter 106. For example, the retention tabs 302 extend away from the interior surface of the housing 122 and engage with a top surface of the cover 124 as depicted in, for example, FIG. 4. The retention tabs 302 engage with a top surface of the cover 124 when the housing 122 is coupled to the base 128. In this manner, when the utility meter 106 is assembled, the housing 122 assists in securing the cover 124, the PCB 120, and the lower support structure 126 within the utility meter 106, and maintains the cover 124, the PCB 120, and the lower support structure 126 within the utility meter 106 in alignment therein. For example, the housing 122 aligns and secures the cover 124, the PCB 120, and the lower support structure 126 in the x-, y-, and/or z-directions.

As mentioned above, the upper pillars 312 and the lower pillars 504 assist in promoting convection of air throughout the internal areas of the utility meter 106 in order to mitigate or eliminate pockets of relatively higher temperature air within the utility meter 106 and more effectively protect the electrical components therein. The cover 124 also includes architectures that assist in promoting convection of air throughout the internal areas of the utility meter 106. In one example, the cover 124 includes a first area such as a surface area of the top side of the cover 124 that is smaller than a second area that is defined by an internal portion of a cross section of the housing 122 at a same elevation of the housing 122 as an elevation of the cover 124 within the housing 122. For example, FIG. 4 depicts a cut-away view of the housing 122 at an elevation of the utility meter 106 approximately at which the cover 124 is seated within the utility meter 106. As depicted in FIG. 4, the cover 124 does not have a circle shape, but, instead, includes a number of truncated or trimmed portions that separate the edge of the cover 124 from the internal edge of the housing 122. Because at least one portion of the perimeter of the cover 124 is separated from the internal surface of the housing 122, air within the utility meter 106 may convect from the base 128 or back of the utility meter 106 to the front of the utility meter 106 including in front of the cover 124.

In one example, the cover 124 may include a perimeter that includes at least one portion that stands off of or away from an interior surface of the housing 122 as described above. In one example, the cover 124 may include a perimeter that includes a first shape that is different from a second shape of a cross section of the housing 122 at an elevation of the housing 122 equal to a position of the cover within the housing. In one example, the cover 124 may include a non-circle shape, and a cross section of the housing 122 at an elevation of the housing 122 equal to a position of the cover 124 within the housing 122 is a circle.

In one example, the cover 124 may include a number of truncations 318 formed around the perimeter of the cover 124. In this example, the cover 124 may retain arcuate portions 320 at corner portions of the cover 124 so that the arcuate portions 320 may interface with the retention tabs 302 of the housing 122. Thus, the cover 124 includes a perimeter that includes at least one portion that stands off of or away from an interior surface of the housing 122. In one example, the truncations 318 may be formed by the cover 124 that would otherwise form a circular cover without the truncations 318 and place the edge of the cover 124 a distance from the interior surface of the housing 122.

In one example, the PCB 120 may also be formed in the shape of a truncated circle as depicted in, for example, FIG. 7. Thus, in a similar manner as the cover 124, the PCB 120 may have truncations 702 and arcuate portions 704 at corner portions of the PCB 120. In this manner, the PCB 120 may allow air to convect past the PCB 120 both to the front portion of the utility meter 106 toward the cover 124 and the back portion of the utility meter 106 toward the base 128 as does the cover 124. In one example, the shape of the PCB 120 may match that of the cover 124.

Air flow and mixing through convection may be impeded by the upper customer facing support structures such as the cover 124 and the PCB 120 but for the truncations 318, 702 and arcuate portions 320, 704 of the cover 124 and the PCB 120, respectively. Further, the upper pillars 312 and the lower pillars 504 of the lower support structure 126 within the utility meter 106 also assist in the convection of air within the utility meter 106. Further, the convective airflow may be maximized while not compromising structural integrity of the utility meter 106 or exposing the sensitive electronic components to harmful UV light exposure by using the systems and methods described herein.

CONCLUSION

Because lower convective airflow, stagnant insulative air spaces, poor air mixing, and higher average temperatures within a utility meter may overstress sensitive electronic components included therein, the described systems and methods make it possible for heat within the utility meter to be regulated such that temperature extremes within different areas within the utility meter are reduced. This provides for a more efficient method of transferring heated air via convection between areas within the utility meter resulting in a relatively more uniform distribution of heated air within the utility meter. With a relatively more uniform distribution of heated air within the utility meter, the sensitive electrical components within the utility meter may be less effected by heat and this, in turn, may extend the life of those electrical components. Further, the minimalist design and the manner in which the housing, cover, PCB, and lower support structure mechanically couple to one another maintains the structural integrity of the utility meter.

While the present systems and methods are described with respect to the specific examples, it is to be understood that the scope of the present systems and methods are not limited to these specific examples. Since other modifications and changes varied to fit particular operating requirements and environments will be apparent to those skilled in the art, the present systems and methods are not considered limited to the example chosen for purposes of disclosure, and covers all changes and modifications which do not constitute departures from the true spirit and scope of the present systems and methods.

Although the application describes examples having specific structural features and/or methodological acts, it is to be understood that the claims are not necessarily limited to the specific features or acts described. Rather, the specific features and acts are merely illustrative of some examples that fall within the scope of the claims of the application.

What is claimed is:

1. A vented support system of a metrology device comprising:
    a lower support structure comprising a number of pillars and a number of first snap-fit fasteners;
    a printed circuit board (PCB), the PCB being coupled to the lower support structure via the number of first snap-fit fasteners; and
    a cover comprising a number of second snap-fit fasteners, the cover being coupled to the PCB via the number of second snap-fit fasteners.

2. The vented support system of claim 1, wherein the number of second snap-fit fasteners further couple the cover to the lower support structure.

3. The vented support system of claim 1, wherein the number of pillars of the lower support structure interface with the PCB, the cover, or a combination thereof.

4. The vented support system of claim 1, further comprising:
    a base; and
    a housing coupled to the base,
    wherein the housing is a white body.

5. The vented support system of claim 4, further comprising:
    at least a first pillar of the number of pillars,
    wherein the first pillar supports the PCB and mechanically couples with the cover, the first pillar causing the PCB to stand off from the lower support structure and causing the cover to stand off from the PCB.

6. The vented support system of claim 5, further comprising:
    at least a second pillar of the number of pillars;
    wherein the second pillar extends from the lower support structure to the base to cause the lower support structure to stand off from the base.

7. The vented support system of claim 4, wherein the cover has a first area smaller than a second area of a cross section of the housing at a same elevation as an elevation of the cover within the housing.

8. The vented support system of claim 4, wherein the cover has a first shape that is different from a second shape of a cross section of the housing at a same elevation as an elevation of the cover within the housing.

9. The vented support system of claim 4, wherein the cover has a non-circle shape, and a cross section of the housing at a same elevation of the housing as an elevation of the cover within the housing is a circle.

10. A metrology device comprising:
    a lower support structure comprising a number of pillars and a number of first snap-fit fasteners;
    a printed circuit board (PCB), the PCB being coupled to the lower support structure via the number of first snap-fit fasteners;
    a cover comprising a number of second snap-fit fasteners, the cover being coupled to the PCB via the number of second snap-fit fasteners; and
    a base supporting the lower support structure.

11. The metrology device of claim 10, further comprising:
    at least a first pillar of the number of pillars,
    wherein the first pillar supports the PCB and mechanically couples with the cover, the first pillar causing the PCB to stand off from the lower support structure and causing the cover to stand off from the PCB.

12. The metrology device of claim 11, further comprising:
    at least a second pillar of the number of pillars,
    wherein the second pillar extends from the lower support structure to a base to cause the lower support structure to stand off from the base.

13. The metrology device of claim 11, wherein the housing is a white body.

14. The metrology device of claim 11, wherein the cover has a first area smaller than a second area of a cross section of the housing at an elevation of the housing equal to a position of the cover within the housing.

15. The metrology device of claim 11, wherein the cover has a first shape that is different from a second shape of a cross section of the housing at an elevation of the housing equal to a position of the cover within the housing.

16. The metrology device of claim 11, wherein the cover has a non-circle shape, and a cross section of the housing at an elevation of the housing equal to a position of the cover within the housing is a circle.

17. A metrology device comprising:
    a housing;
    a lower support structure disposed in the housing, the lower support structure comprising a number of pillars and a number of first snap-fit fasteners;
    a printed circuit board (PCB), the PCB being coupled to the lower support structure via the number of first snap-fit fasteners; and
    a cover comprising a number of second snap-fit fasteners, the cover being coupled to the PCB via the number of second snap-fit fasteners.

18. The metrology device of claim 17, wherein the housing supports the cover in three coordinate directions.

19. The metrology device of claim 17, further comprising:
    at least a first pillar of the number of pillars, the first pillar supporting the PCB and mechanically coupling with the cover, the first pillar causing the PCB to stand off from the lower support structure and causing the cover to stand off from the PCB; and
    at least a second pillar of the number of pillars, the second pillar extending from the lower support structure to a base to cause the lower support structure to stand off from the base.

* * * * *